(12) United States Patent
Schmitt

(10) Patent No.: US 9,470,736 B2
(45) Date of Patent: Oct. 18, 2016

(54) WIRING TEST DEVICE FOR ELECTRONICS CABINETS HAVING INTERNAL SIGNAL WIRING

(75) Inventor: Reinhard Schmitt, Landau (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 220 days.

(21) Appl. No.: 14/237,883

(22) PCT Filed: Aug. 10, 2012

(86) PCT No.: PCT/EP2012/065721
§ 371 (c)(1),
(2), (4) Date: Feb. 9, 2014

(87) PCT Pub. No.: WO2013/029967
PCT Pub. Date: Mar. 7, 2013

(65) Prior Publication Data
US 2014/0203795 A1    Jul. 24, 2014

(30) Foreign Application Priority Data

Aug. 29, 2011  (DE) .................. 10 2011 081 713

(51) Int. Cl.
*G01R 31/02* (2006.01)
*G01R 31/04* (2006.01)

(52) U.S. Cl.
CPC ........... *G01R 31/021* (2013.01); *G01R 31/041* (2013.01)

(58) Field of Classification Search
USPC .................. 324/508, 66, 539; 361/724, 735; 307/147
See application file for complete search history.

(56) References Cited

U.S. PATENT DOCUMENTS

| 5,552,699 | A | * | 9/1996 | Redmer | G01R 31/041 324/539 |
| 5,744,967 | A | * | 4/1998 | Sorensen | G01R 31/008 324/539 |
| 6,525,526 | B1 | * | 2/2003 | De Gruyter et al. | G01R 31/2805 324/537 |
| 2002/0098728 | A1 | * | 7/2002 | Kedrowski | H01R 13/6315 439/131 |
| 2004/0066202 | A1 | | 4/2004 | Huot | |
| 2010/0198227 | A1 | * | 8/2010 | Kim | A61B 5/1076 606/102 |

FOREIGN PATENT DOCUMENTS

| CN | 101464490 A | 6/2009 |
| CN | 101545946 A | 9/2009 |
| CN | 101551406 A | 10/2009 |
| DE | 4133354 A1 | 4/1993 |
| DE | 19604624 C2 | 8/1998 |

* cited by examiner

*Primary Examiner* — Melissa Koval
*Assistant Examiner* — Nasima Monsur
(74) *Attorney, Agent, or Firm* — Beusse Wolter Sanks & Maire

(57) ABSTRACT

A wiring test device for electronics cabinets having internal signal wiring between a first section having a matrix-like arrangement of inputs and outputs and a second section having inputs and outputs is provided. The test device includes a needle adapter having a number of test points arranged in the manner of a matrix to be placed on and make contact with the inputs and outputs of the first section, and test adapter communicating with the needle adapter and having a test point to make contact with individual inputs and outputs of the second section, and a monitoring device which, for each of the inputs and outputs of the second section of the selected electronics cabinet with which contact is made, checks whether the internal signal wiring thereof corresponds to a previously stored wiring list for the electronics cabinet.

18 Claims, 1 Drawing Sheet

WIRING TEST DEVICE FOR ELECTRONICS CABINETS HAVING INTERNAL SIGNAL WIRING

CROSS REFERENCE TO RELATED APPLICATIONS

This application is the US National Stage of International Application No. PCT/EP2012/065721 filed Aug. 10, 2012, and claims the benefit thereof. The International Application claims the benefit of German Application No. DE 102011081713.1 filed Aug. 29, 2011. All of the applications are incorporated by reference herein in their entirety.

FIELD OF INVENTION

The invention relates to a wiring test device for electronics cabinets.

BACKGROUND OF INVENTION

In order to control and regulate industrial installations, large numbers of input and output signals from a large number of actuators and sensors have to be combined in a control system for further processing. This is usually performed in centralized or decentralized electronics cabinets by means of cabinet-internal wiring systems for electrically connecting the actuators and sensors to superordinate control systems. Nowadays, this cabinet-internal signal wiring is performed in what are known as jumpering units which, according to a wiring plan which is defined during the installation plan, are configured such that the inputs and outputs of the various actuators and sensors are electrically connected to the corresponding inputs and outputs of the control systems in accordance with the installation plan.

For the purpose of reliable operation, a wiring test has to be carried out before the installation is put into operation. A simple test method involves testing each individual signal wiring arrangement in succession by means of a continuity test device in order to determine whether the signal wiring also corresponds to the wiring from the wiring list which is planned and stored for this installation. A method of this kind is time-consuming and, specifically in the case of large electronics cabinets, or else arrangements which are composed of a plurality of subordinate distributor cabinets, usually cannot be implemented by one tester.

SUMMARY OF INVENTION

An object herein is to provide a wiring test device which overcomes the above-described disadvantages.

This object is achieved by the wiring test device having the features described herein.

The wiring test can be simplified on account of a measuring means with a number of test probes, which are arranged in a matrix-like manner and are to be mounted on and make contact with a field having inputs and outputs which are arranged in a matrix-like manner, now being available and communicating with a second measuring means having a test probe. In an electronics cabinet, the inputs and outputs to the actuators and sensors are often arranged on predefined fields in the electronics cabinet in a matrix-like manner in one-dimensional rows or in two dimensions, and the inputs and outputs to the superordinate control systems are arranged in different fields in a similar way. Instead of the previous successive wiring testing of individual input and output terminals of the fields using a continuity test device, appropriately designed measuring means can now be mounted on fields with inputs and outputs which are arranged in a matrix-like manner, and therefore this measuring means can equally make contact with a plurality of inputs and outputs at the same time and, together with the further second measuring means having a test probe and a monitoring device, a plurality of signal wiring systems can be tested one after the other solely by a single person, without the two measuring means having to re-establish contact with the corresponding contacts of the inputs and outputs into the two fields each time for each of the signal wiring tests. Rather, it is sufficient for there to be a single tester who has to establish contact with the respective input or output only on one contact field using the measuring means having the test probe, so that the wiring test is less time-consuming overall. In this case, the above-mentioned fields having inputs and outputs which are arranged in a matrix-like manner may be the entire field-side or control system-side connection area of an electronics cabinet or else only a partial area thereof.

The wiring test device herein can be used universally when a selection means is provided, with which the wiring list for the electronics cabinet which is to be tested can be selected from a number of stored wiring lists and is enabled for the monitoring device.

The person carrying out the test can monitor the wiring test in a simple manner when a confirmation means acoustically and/or visually indicates whether the internal signal wiring, which is currently to be tested, between the inputs and outputs of the first and second fields corresponds to the stored wiring from the wiring list.

The test sequence can be further optimized when the monitoring device is designed such that the wiring which is to be tested next is selected from the wiring list when the confirmation means indicates that the internal signal wiring which is currently to be tested corresponds to the stored wiring. This can be performed automatically or manually depending on the required level of reliability.

Wireless communication between the first and second measuring means is advantageous specifically in the case of cabinets of larger dimensions or in the case of spatially distributed subordinate distributor cabinets since, in this way, distances in complex cabinet arrangements can also be bridged without problems on account of the wireless communication.

If the second measuring means has a display for displaying at least the signal wiring which is currently to be tested and this display is additionally arranged in a rotatable or pivotable manner, the test personnel can also visually monitor the measurement from various viewing angles in a simple manner. Therefore, an optimum viewing angle can always be set during testing, as a result of which it is possible for personnel to work in an ergonomic manner both in the horizontal and in the vertical working position during testing.

The test probes of the first and/or second measuring means can advantageously be replaced or exchanged, so that the measuring means can be matched to any desired terminals of the input or output fields.

A particularly simple structural design is produced when the first measuring means, which is of larger dimensions on account of its measuring means which is arranged in a matrix-like manner, already comprises the monitoring device, and additionally has a slot for a memory card, on which wiring lists are stored, or else has a storage medium on which the wiring lists can be played.

For the purpose of mounting the first measuring means, the first measuring means has fastening means with which the first measuring means can be fastened on the first field having the matrix-like arrangement of inputs and outputs in a direct manner or via an adapter as an additional mechanical component. When designing the fastening means, care should be taken, in particular, that the fastening element performs the following tasks:

fixes the position of the first measuring means and locks said first measuring means in all three axes on the field which is to be tested, absorbs a counterforce which is produced by the contact-pressure force of the test probes, detaches the first measuring means from the field after the wiring test has been performed.

BRIEF DESCRIPTION OF THE DRAWINGS

The invention will now be explained by way of example with reference to the following figures, in which.

DETAILED DESCRIPTION OF INVENTION

Figure 2:
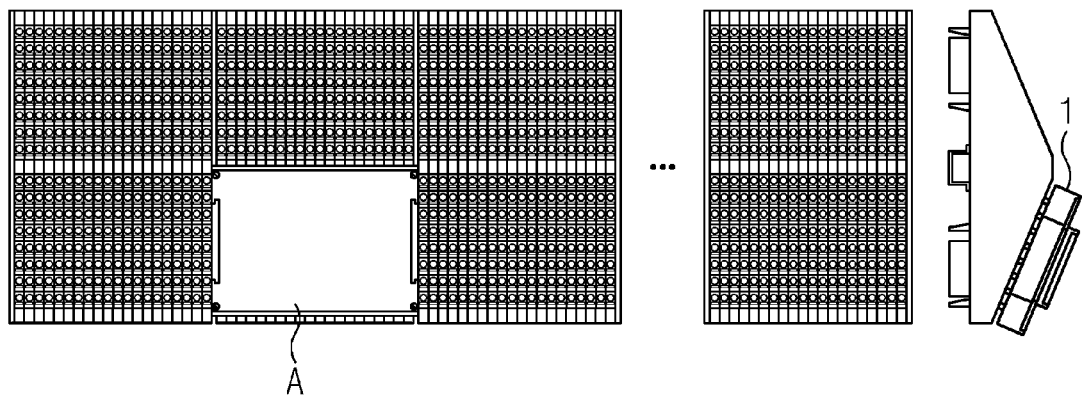

By virtue of the wiring test device which is designed according to the invention, the wiring test can in future be carried out solely by a single person (tester), for example in a control system cabinet. To this end, the cabinet-specific wiring list is preferably available as a file on a memory card ready for connection testing. At the beginning of the connection test, the tester establishes contact between the first measuring means 1—in this case a matrix-like needle adapter—and a first terminal field or partial block field on the field connection side of the control system cabinet, that is to say on the connection field to which the actuators and sensors are connected (FIG. 2). For the connection test, the tester then only has to make contact with the corresponding inputs and outputs of the field of the control system connection side in succession using the second measuring means 2—in this case a test adapter with a display unit 5—in accordance with the cabinet-specific wiring list. As soon as the needle adapter 1 is mounted on the first field, the wiring list according to which the test should be carried out is selected with the aid of the selection means 3—in this case a function key. Once the selected wiring list is enabled, the display unit 5 displays the first test address at the beginning of the test for this first test field. If the first test field is processed, the display unit 5 displays the next field with the associated first test address in this test field. In order to continue the test, the tester now has to establish contact between the needle adapter 1 and this second field. This procedure is repeated until the last field is processed and, for example, "END" can be read in the display.

The basis of a quality-assured wiring test of this kind is a connection list which was generated by universal design tools. The two ends of a connection have to be clearly defined in this connection list. A clear connection list can be electronically generated in this way by defining the installation site identifiers for a cabinet wiring concept. For wiring testing, this list has to be correspondingly prepared and preferably stored on a memory card. Therefore, each connection list can be clearly associated with a cabinet. All of the connection lists of an installation project can therefore be stored together on a memory card, and all of the cabinets or cabinet combinations of a planned industrial installation can be tested in succession in this way.

In the present exemplary embodiment, jumpering terminals in the form of eight-stage terminal strips are used in the control system cabinet (FIG. 2). These terminals have a symmetrical design and the input and output sides of the terminals are connected to one another in a ratio of 1:1. In the present cabinet wiring concept, these terminals are arranged in the lower region of the control system cabinet. The input side of these terminals is intended to represent the connection terminals for the field side. The output side of these terminals is intended to correspond to the jumpering terminals of the cabinet side which are then connected to the corresponding connection terminals for the control system via the jumpering cabling in the cabinet.

The terminal strips can be lined up as often as desired on a top-hat rail and therefore form very large connection fields with several hundred inputs and outputs. In order to nevertheless be able to mechanically securely adapt the matrix-like needle adapter 1 to these terminal strips, the terminal strips were divided into field blocks with in each case 20 terminal strips (8×20 terminal strips=160 contact points) in the present exemplary embodiment, in order to then fix the matrix-like needle adapter 1 on one of these field blocks by means of an adapter plate A.

Figure 1:
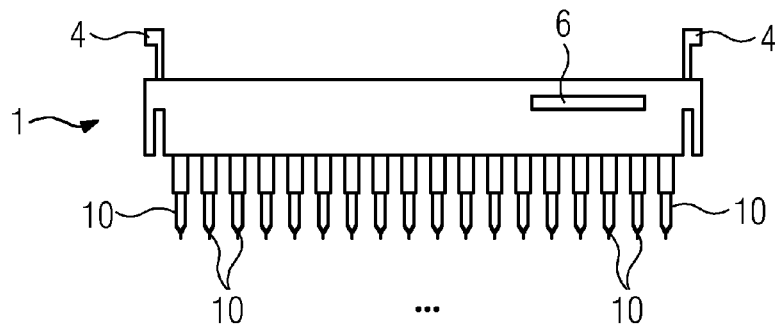
FIG. 1 schematically shows a side view of the first measuring means having test probes which are arranged in a matrix-like manner, FIG. 2 schematically shows the first measuring means mounted on a matrix-like field, FIG. 3 schematically shows the corresponding second measuring means.

The needle adapter (FIG. 1) which is designed according to the invention in the form of a first measuring means 1 in this case comprises a housing 8 having the following integrated components:

an electronics module (which is not illustrated in any detail) as a monitoring device;

a printed circuit board (which is not illustrated in any detail) having test needles 10, wherein the printed circuit board is populated with 160 test needles in accordance with the above-described field size in this case;

a slot 6 for memory cards;

optionally a power supply plug for connection of an external power supply or an on/off switch when a battery is used for supplying power;

and fastening means 4 with which the needle adapter can be securely fastened on the partial field blocks by way of in each case 160 contact points.

Figure 3:
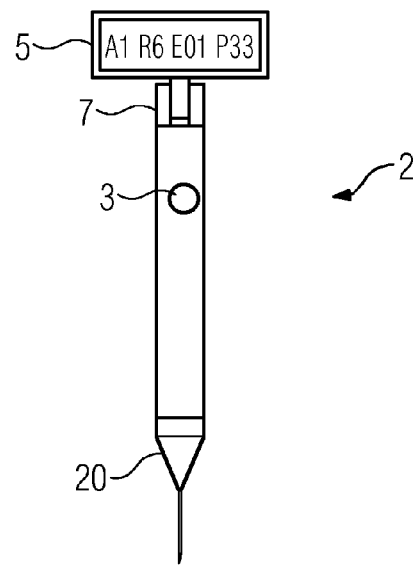

The test adapter (FIG. 3) which is designed according to the invention in the form of a second measuring means 2 in this case comprises a housing 9 having the following components:

a rotatable or pivotable display unit 5;

a function key 3 as selection means;

a test probe 20;

and optionally an on/off switch if a battery is used as the power supply.

In this case, the test adapter 2 communicates with the electronics module of the needle adapter 1 via a communication interface (not illustrated in any detail). This communication can be performed with wires or wirelessly.

In the present exemplary embodiment, the display unit 5 is the communication interface to the tester. The display unit 5 is connected to the housing of the test adapter 2 with the aid of a rotary joint. This ensures that the tester can always set the optimum viewing angle and ergonomic work is ensured both in the vertical and in the horizontal working position.

At the beginning of a wiring test, the display unit 5 displays the file name of any desired stored connection list. The selection means 3 can be used to call up the stored connection lists in succession and the selected file can be activated by operating said selection means for an extended period of time. The first connection address then appears in the first test segment. In this case, a correctly completed signal wiring test can additionally be confirmed by means of a confirmation means, such as an acoustic signal or corresponding visual display for example. At the same time, the next connection address appears in the display unit and the test result is electronically entered in the connection list by OK. If the signal test is negative, the connection address in the display is not advanced until the faulty signal connection has been repaired.

The wiring test is successfully terminated when the word "End" appears in the display. The processed connection list no longer appears in the display area when the function key is operated in order to search for a new connection list. The test process for the next cabinet is started afresh.

The above-described exemplary embodiment describes only one possible design according to the invention of a wiring test device which is designed for a specific type of terminal. However, the needle adapter 1 could also, in principle, itself be of modular construction comprising exchangeable needle adapters and an electronics module which can be connected to one another via corresponding removable interfaces. This would have the advantage that different adapters could also be used for the program-controlled wiring test unit according to the invention. A further alternative solution could involve the user software of the monitoring device running on a standard computer (PC). The PC screen can then also perform the selection, confirmation and display functions of the test adapter. Therefore, the test adapter comprises only a housing with a test probe which is coupled to the PC in a wireless or wire-bound manner.

Therefore, overall, the apparatus according to the invention can be used to reliably test planned wiring systems of electronics cabinets and, at the same time, a clear reduction in test costs can be achieved by the reduced use of personnel.

Project requirements such as extremely short project development times, extremely cost-effective realization of the connections and maximum availability of the connections can be fulfilled to almost 100%.

In the specific design of the fastening means of the first measuring means, it should be noted that the fastening element reliably performs the following tasks:

fixes the position of the first measuring means and locks said first measuring means in all three axes on the field which is to be tested, absorbs a counterforce which is produced by the contact-pressure force of the test probes, detaches the first measuring means from the field after the wiring test has been performed.

In this case, the fastening means can engage directly into corresponding fastening means of the terminal fields or else—as illustrated in FIG. 2—into corresponding fastening means of an adapter A which itself can again be fastened on the terminal field. In order to absorb the active forces, it is particularly advantageous when the fastening means provided are latching lugs which engage into corresponding fastening means, which are in the form of latching hooks, of the field with which contact is to be made, or vice versa. In order to reliably detach the measuring means, the latching hooks and/or latching lugs are of elastic design. Fixing the position of the first measuring means and locking said first measuring means on the field or the adapter and fixing said measuring means is performed by means of correspondingly arranged grooves and pins or other guides. Therefore, a clear dimensional relationship between the contact points of the needle adapter and the contact points of the terminal strips is produced.

The invention claimed is:

1. A wiring test device for electronics cabinets having internal signal wiring, an electronics cabinet including a first field having a matrix-like arrangement of inputs and outputs to a field connection side of the cabinet, and a second field having inputs and outputs to a control system connection side to superordinate control systems, comprising a first measuring means having a number of test probes, which are arranged in a matrix-like manner and are mountable on and make contact with the inputs and outputs of the first field to the field connection side of the cabinet to actuators and sensors, and a second measuring means, which communicates with the first measuring means, having a test probe for making contact with individual inputs and outputs of the second field to a control system connection side to superordinate control systems, and a monitoring device which, for each of the inputs and outputs of the second field of a selected electronics cabinet with which contact is made, checks whether the internal signal wiring of said selected electronics cabinet corresponds to a previously stored wiring list for this electronics cabinet wherein the first measuring means comprises the monitoring device and has a slot for a memory card on which wiring lists are stored and/or a storage medium on which the wiring lists can be played.

2. The wiring test device as in claim 1, further comprising a selection means, with which the wiring list for the electronics cabinet which is to be tested can be selected from a number of stored wiring lists and is enabled for the monitoring device.

3. The wiring test device as in claim 1, further comprising a confirmation means, which indicates whether the internal signal wiring, which is currently to be tested, between the inputs and outputs of the first and second fields corresponds to the stored wiring from the wiring list.

4. The wiring test device as in claim 3, wherein the monitoring device is designed such that the wiring which is to be tested next is selected from the wiring list when the confirmation means indicates that the internal signal wiring which is currently to be tested corresponds to the stored wiring.

5. The wiring test device as in claim 1, wherein the first and the second measuring means communicate with one another via a wireless communication interface.

6. The wiring test device as in claim 1, wherein the second measuring means has a display for displaying at least the signal wiring which is currently to be tested.

7. The wiring test device as in claim 6, wherein the display is mounted in a rotatable or pivotable manner.

8. The wiring test device as in claim 1, wherein the test probes of the first and/or second measuring means are replaceable.

9. The wiring test device as in claim 1, wherein the first measuring means has fastening means with which the first measuring means can be fastened on the first field having the matrix-like arrangement of inputs and outputs.

10. The wiring test device as in claim 9, wherein the fastening means comprise latching lugs which engage into corresponding fastening means, which are in the form of latching hooks, of the first field.

11. The wiring test device as in claim 9, wherein the fastening means are designed such that they interact with complementary fastening means of an adapter such that the first measuring means can be fastened on the first field having the matrix-like arrangement of inputs and outputs by means of said adapter.

12. The wiring test device as in claim 1, wherein the test probes of the first measuring means are replaced to match to terminals of the inputs or the output.

13. The wiring test device as in claim 1, wherein the first measuring means comprises a fastening means configured to fix the position of the first measuring means, lock said first measuring means in all three axes on the first field which is to be tested, absorb a counterforce which is produced by contact-pressure force of the test probes; and detaches the first measuring means from the first field after the wiring test has been performed.

14. The wiring test device as in claim 1, wherein connection lists of an installation project is stored together on the memory card, and all cabinets of a planned installation can be tested in succession.

15. The wiring test device as in claim 1, wherein the first measuring means being coupled to a terminal strip of a plurality of terminal strips divided into field blocks, wherein each terminal strip has 160 contact points.

16. The wiring test device as in claim 6, wherein if a test of the currently test wiring is negative, a connection address on the display is not advanced until a faulty signal connection has been repaired.

17. The wiring test device as in claim 1, wherein the inputs and outputs of the actuators and sensors are electrically connected to the corresponding inputs and outputs of the control systems.

18. A wiring test device for electronics cabinets having internal signal wiring, an electronics cabinet including a first field having a matrix-like arrangement of inputs and outputs to a field connection side of the cabinet, and a second field having inputs and outputs to a control system connection side to superordinate control systems, comprising
a first measuring means having a number of test probes, which are arranged in a matrix-like manner and are mountable on and make contact with the inputs and outputs of the first field to the field connection side of the cabinet to actuators and sensors, and
a second measuring means, which communicates with the first measuring means, having a test probe for making contact with individual inputs and outputs of the second field to a control system connection side to superordinate control systems, and
a monitoring device which, for each of the inputs and outputs of the second field of a selected electronics cabinet with which contact is made, checks whether the internal signal wiring of said selected electronics cabinet corresponds to a previously stored wiring list for this electronics cabinet wherein the first measuring means comprises the monitoring device and has a slot for a memory card on which wiring lists are stored and/or a storage medium on which the wiring lists can be played and the first measuring means has fastening means with which the first measuring means can be fastened on the first field having the matrix-like arrangement of inputs and outputs.

* * * * *